US010833688B2

(12) United States Patent
Doi et al.

(10) Patent No.: US 10,833,688 B2
(45) Date of Patent: Nov. 10, 2020

(54) ELECTRONIC CONTROL DEVICE

(71) Applicant: Hitachi Automotive Systems, Ltd., Hitachinaka (JP)

(72) Inventors: Masahiro Doi, Hitachinaka (JP); Atsushi Arata, Hitachinaka (JP)

(73) Assignee: Hitachi Automotive Systems, Ltd., Hitachinaka (JP)

( * ) Notice: Subject to any disclaimer, the term of this patent is extended or adjusted under 35 U.S.C. 154(b) by 0 days.

(21) Appl. No.: 16/610,321

(22) PCT Filed: Apr. 11, 2018

(86) PCT No.: PCT/JP2018/015176
§ 371 (c)(1),
(2) Date: Nov. 1, 2019

(87) PCT Pub. No.: WO2018/235403
PCT Pub. Date: Dec. 27, 2018

(65) Prior Publication Data
US 2020/0083895 A1 Mar. 12, 2020

(30) Foreign Application Priority Data

Jun. 23, 2017 (JP) ................. 2017-123585

(51) Int. Cl.
*H03M 1/12* (2006.01)
*H03M 1/06* (2006.01)
*G05F 1/575* (2006.01)
(52) U.S. Cl.
CPC ............. *H03M 1/06* (2013.01); *G05F 1/575* (2013.01); *H03M 1/12* (2013.01)
(58) Field of Classification Search
CPC ........... H03M 1/06; H03M 1/12; G05F 1/575; G05F 1/56
(Continued)

(56) References Cited

U.S. PATENT DOCUMENTS 3,665,365 A * 5/1972 Hartman ................ H01C 10/18
338/190
4,810,948 A 3/1989 Takuma
(Continued)

FOREIGN PATENT DOCUMENTS

JP 5-63569 A 3/1993
JP 2577897 B2 11/1996
(Continued)

OTHER PUBLICATIONS

International Search Report (PCT/ISA/210) issued in PCT Application No. PCT/JP2018/015176 dated Jun. 12, 2018 with English translation (four (4) pages).
(Continued)

*Primary Examiner* — Jean B Jeanglaude
(74) *Attorney, Agent, or Firm* — Crowell & Moring LLP

(57) ABSTRACT

An inexpensive electronic control device is implemented that enables a power supply voltage supplied to a microcomputer to be varied using a simple method and that enables an identical power supply to be adapted to various microcomputers. A switch is turned on to determine the value of a discrete resistor, and a voltage based on the value of current from a current source and the resistance value of the discrete resistor is caused in an In1 terminal. By an A/D converter, the In1 terminal voltage is subjected to A/D conversion, and a digital code corresponding to the selectively connected discrete resistor is detected. The result of the A/D conversion is saved in a register, and the determination of the resistance value of the discrete resistor performed by the A/D converter is completed. After the completion of the resistance value determination performed by the A/D converter, power supply voltages start activation. The core voltage activates to secure a voltage corresponding to
(Continued)

a reference voltage set by the register and thereby a desired power supply is completed.

13 Claims, 4 Drawing Sheets

(58) Field of Classification Search
USPC .......................................................... 341/155
See application file for complete search history.

(56) References Cited

U.S. PATENT DOCUMENTS

| | | | |
|---|---|---|---|
| 5,349,351 A | 9/1994 | Obara et al. | |
| 5,978,242 A | 11/1999 | Raad et al. | |
| 7,480,578 B2* | 1/2009 | Sutardja | G01R 31/2884 324/762.02 |
| 7,812,746 B2* | 10/2010 | Le | H03M 1/1014 341/118 |
| 9,859,910 B1* | 1/2018 | Kim | H03M 1/0678 |
| 9,935,643 B1* | 4/2018 | Chang | H03M 1/462 |
| 2002/0016932 A1 | 2/2002 | Kushiyama | |
| 2008/0048737 A1 | 2/2008 | Ito et al. | |
| 2016/0191072 A1* | 6/2016 | Rath | H03M 1/468 341/122 |

FOREIGN PATENT DOCUMENTS

| | | |
|---|---|---|
| JP | 11-78771 A | 3/1999 |
| JP | 11-503898 A | 3/1999 |
| JP | 2002-9604 A | 1/2002 |
| JP | 2009-543193 A | 12/2009 |
| WO | WO 2006/059438 A1 | 6/2006 |
| WO | WO 2008/005112 A2 | 1/2008 |

OTHER PUBLICATIONS

Japanese-language Written Opinion (PCT/ISA/237) issued in PCT Application No. PCT/JP2018/015176 dated Jun. 12, 2018 (five (5) pages).

* cited by examiner

ELECTRONIC CONTROL DEVICE

TECHNICAL FIELD

The present invention relates to an electronic control device having a constant voltage power supply.

BACKGROUND ART

A microcomputer mounted on an electronic control device requires a plurality of different power supply voltages depending on the model. For a core power supply voltage among these, in particular, a different power supply voltage is required for each model of the microcomputer due to miniaturization of semiconductors.

Supply of power supply voltage to a microcomputer is generally performed by a power supply circuit composed of a power supply IC (integrated circuit) which is a semiconductor integrated circuit and its peripheral circuits, and a power supply voltage to be applied is determined in the development stage.

For this reason, in the development of control devices in which microcomputers using different power supply voltages are mounted, redesign of the power supply circuit including redesign of the power supply IC is necessary. Further, in the case of a power supply IC that generates a fixed power supply voltage, the power supply IC needs to be redesigned, which increases the development cost and the cost of the electronic control device.

Therefore, supply of power supply voltages for various microcomputers with a single power supply circuit makes redesign of the power supply circuit unnecessary, thereby reducing development costs and shortening the development period.

As a conventional technique for solving this problem, there is a method of allowing the output voltage to be variable by changing the amplification degree of the operational amplifier.

For example, in the technique described in Patent Document 1, the ratio of the negative feedback resistance of resistors connected to the output voltage is switched by a multiplexer according to the setting of a data register such as an EEPROM, thereby changing the amplification degree of the operational amplifier to make the output voltage variable, for the purpose of adjusting the output voltage.

PRIOR ART DOCUMENT

Patent Document

Patent Document 1: Japanese Patent No. 2577897

SUMMARY OF THE INVENTION

Problems to be Solved by the Invention

The technique described in Patent Document 1 is a constant voltage power supply circuit configured to control an output voltage by using a data register and a multiplexer. If this data register is implemented by the EEPROM in the power supply IC, a semiconductor process capable of manufacturing the EEPROM is required, which increases the cost of the power supply IC and the power supply circuit.

Further, if the value of the EEPROM corresponding to each power supply voltage is recorded at the time of manufacturing the power supply IC, there is a problem that the management cost increases due to an increase in the number of types of power supply ICs, resulting in an increase in cost.

Further, if an EEPROM installed outside the power supply IC is also used, the cost is increased due to addition of the component. On the other hand, since the EEPROM mounted on the microcomputer is a memory that can be used after power supply voltage is supplied to the microcomputer, the EEPROM cannot be used for setting the power supply voltage to the microcomputer.

An object of the present invention is to implement a low-cost electronic control device that enables a power supply voltage supplied to a microcomputer to be varied with a simple method and enables an identical power supply IC to be adapted to various microcomputers.

Means for Solving the Problems

In order to accomplish the above object, the present invention is configured as follows.

The electronic control device includes an integrated circuit having a voltage adjustment unit and a discrete component connected to the above-mentioned integrated circuit, and the voltage output from the above voltage adjustment unit is changed by changing the above discrete component.

Effects of the Invention

According to the power supply circuit related to the present invention, a low-cost electronic control device can be implemented that enables a power supply voltage supplied to the microcomputer to be varied with a simple method and enables an identical power supply IC to be adapted to various microcomputers.

MODES FOR CARRYING OUT THE INVENTION

Hereinafter, embodiments of the present invention will be described in detail with reference to the accompanying drawings.

EMBODIMENTS

First Embodiment

Figure 1:
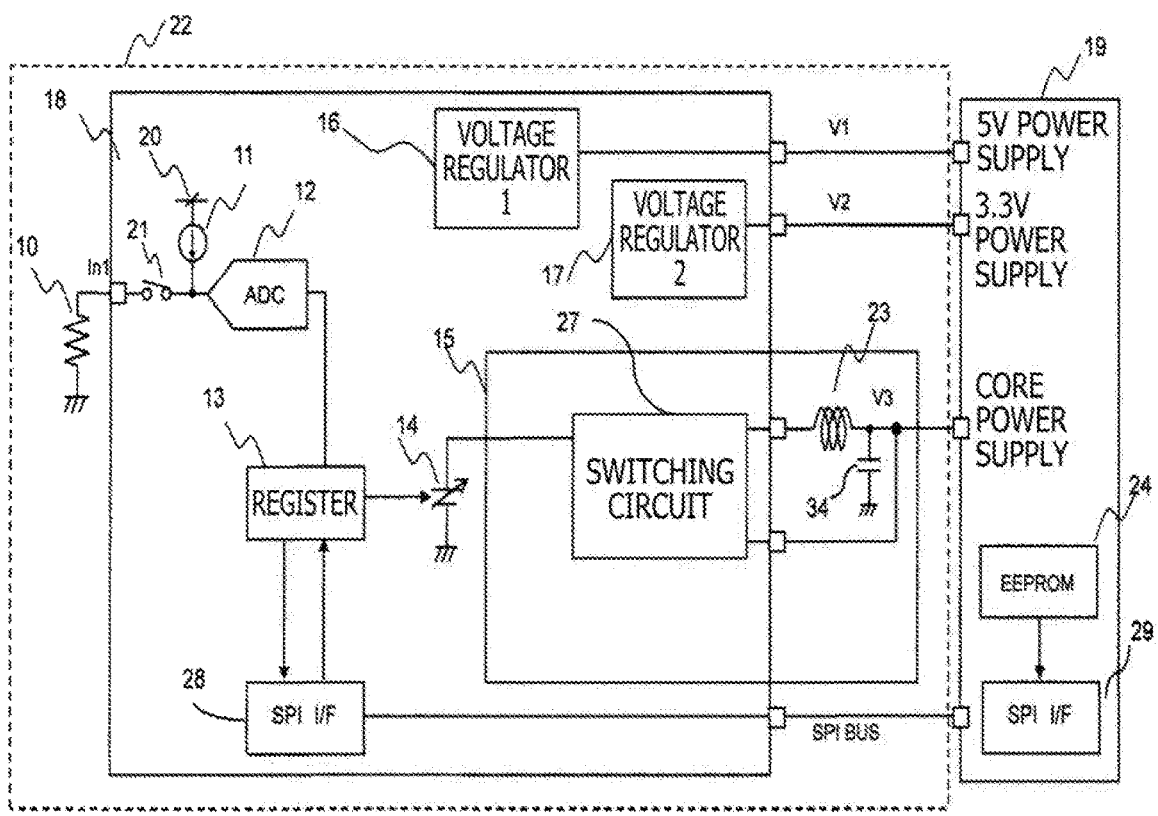
FIG. 1 is a schematic configuration diagram of an electronic control device according to a first embodiment of the present invention.

FIG. 1 is a schematic configuration diagram of a power supply circuit 22 that is an electronic control device according to the first embodiment of the present invention.

The power supply circuit 22, which is an electronic control device, is a circuit that supplies power to a microcomputer 19. The power supply circuit 22 includes a power supply integrated circuit (IC) 18, and peripheral elements such as a discrete resistor 10 (first resistor), an inductor 23 and a capacitor 34.

The power supply circuit 22 includes a voltage regulator 16 (voltage regulator 1 (first voltage regulator)), voltage regulator 17 (voltage regulator 2 (second voltage regulator)), and switching power supply 15 for supplying a plurality of power supply voltages to the microcomputer 19.

The voltage regulators 16 and 17 and the switching power supply 15 causes the reference voltage provided for these respective components to be subjected to negative feedback amplifying by using an operational amplifier, for example, thereby generating respective desired output voltages V1, V2, and V3. Here, the power supply IC 18 includes a reference voltage 14 for selectively switching the core voltage V3 for the microcomputer 19 requiring various power supply voltages to a desired voltage. This reference voltage 14 is a variable voltage source.

The discrete resistor 10 is connected to the power supply IC 18 and can be selectively attached as a resistor having an appropriate resistance value in order to adjust the reference voltage 14. In other words, the voltage value of the voltage V3 can be changed simply by selecting the resistance value of the discrete resistor 10 and externally attaching the resistor to the power supply IC 18.

The discrete resistor 10 is connected to a register 13 via a switch 21 (first switch) and an A/D converter 12. Further, by closing the switch 21, a current flows to the discrete resistor 10 through the switch 21 from a current source 11 connected to an internal voltage source 20 of the power supply integrated circuit 18 (IC) and connected to a point between the switch 21 and the A/D converter 12. When a current flows through the discrete resistor 10, a voltage is generated at In1 that is a connection terminal between the discrete resistor 10 and the power supply IC 18. The generated voltage is converted into a desired digital code by the A/D converter 12.

After the digital code after A/D conversion by the A/D converter 12 is stored in the register 13, a voltage corresponding to the digital code stored in the register 13 is set in the reference voltage source 14. Then, a switching circuit 27 of the switching power supply 15 is activated according to the voltage set in the reference voltage source 14.

The switching circuit 27 can include a comparator, an operational amplifier, a resistor, a switching element, and the like, and the capacitor 34 is connected to the switching circuit 27 via the inductor 23 outside the power supply IC 18 to generate a desired core voltage V3. The power supply voltages V1 and V2 of the microcomputer 19 are also generated by the voltage regulator 16 and the voltage regulator 17 of the power supply circuit 22, and the microcomputer 19 can operate by being supplied with power.

In the illustrated example, the voltage V1 is 5 V, the voltage V2 is 3.3 V, and the voltage of the core power supply is 0.9 to 1.6 V.

Figure 3:
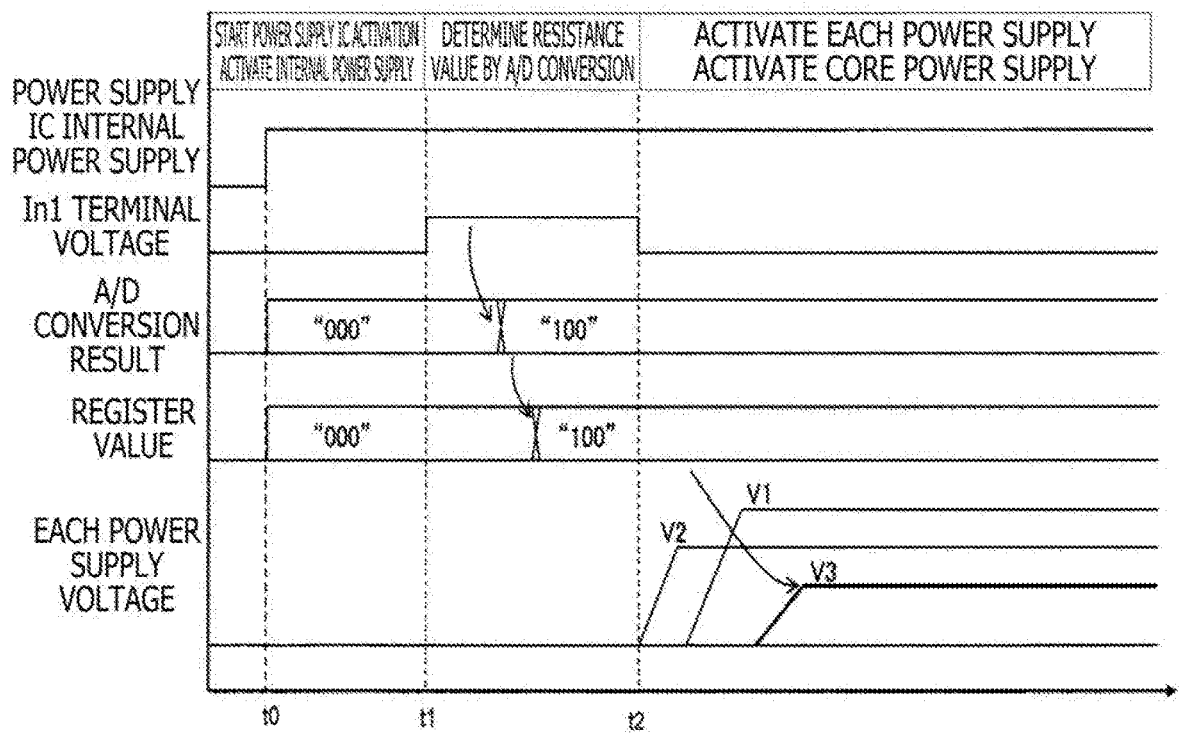
FIG. 3 is an activation time chart of the power supply circuit according to the first embodiment of the present invention.

FIG. 3 is an activation time chart of the power supply circuit 22, according to the first embodiment of the present invention.

In FIG. 3, first, when the power supply IC 18 is turned on at time t0, the internal power supply of the power supply IC 18 starts up. Next, at time t1, in order to determine the value of the discrete resistor 10, the switch 21 is turned on and then a voltage corresponding to the value of current from the current source 11 and the resistance value of the discrete resistor 10 is generated at the In1 terminal.

The In1 terminal voltage is subjected to A/D-conversion of the A/D converter 12, and a digital code corresponding to the selectively connected discrete resistor 10, namely "100" in the case of the example in FIG. 3 is detected.

The value "100" which is the A/D conversion result, is stored in the register 13 instead of the initial value "000," and the resistance value determination of the discrete resistor 10 by the A/D converter 12 is completed.

After the resistance value determination by the A/D converter 12 is completed, the power supply voltages V1, V2, and V3 start activation at time t2. At this time, the activation order of power supply voltages is described as V2, V1, and V3 in the example depicted in FIG. 3, but the order is not limited thereto.

The core voltage V3 is activated to secure a voltage corresponding to the reference voltage 14 set by the value "100" of the register 13, whereby the desired power supply is completed.

The register 13 can read and write data by SPI communication between an SPI interface 28 and an SPI interface 29 of the microcomputer 19 or the like.

After the microcomputer 19 is activated by the power supply of the power supply IC 18 in the above-described procedure, the value of the register 13 of the power supply IC 18 can be read to confirm whether the digital code is the desired code.

Here, in the pre-shipment test of the power supply circuit 22, if the core voltage V3 output by using the predetermined discrete resistor 10 deviates from the design value, and if another digital code is closer to the design value, the value of the register 13 can be reset after the microcomputer 19 is activated by recording the digital code to be used for the reset in an EEPROM 24 (memory) of the microcomputer 19, and the core voltage V3 can be set with higher accuracy.

Figure 4:
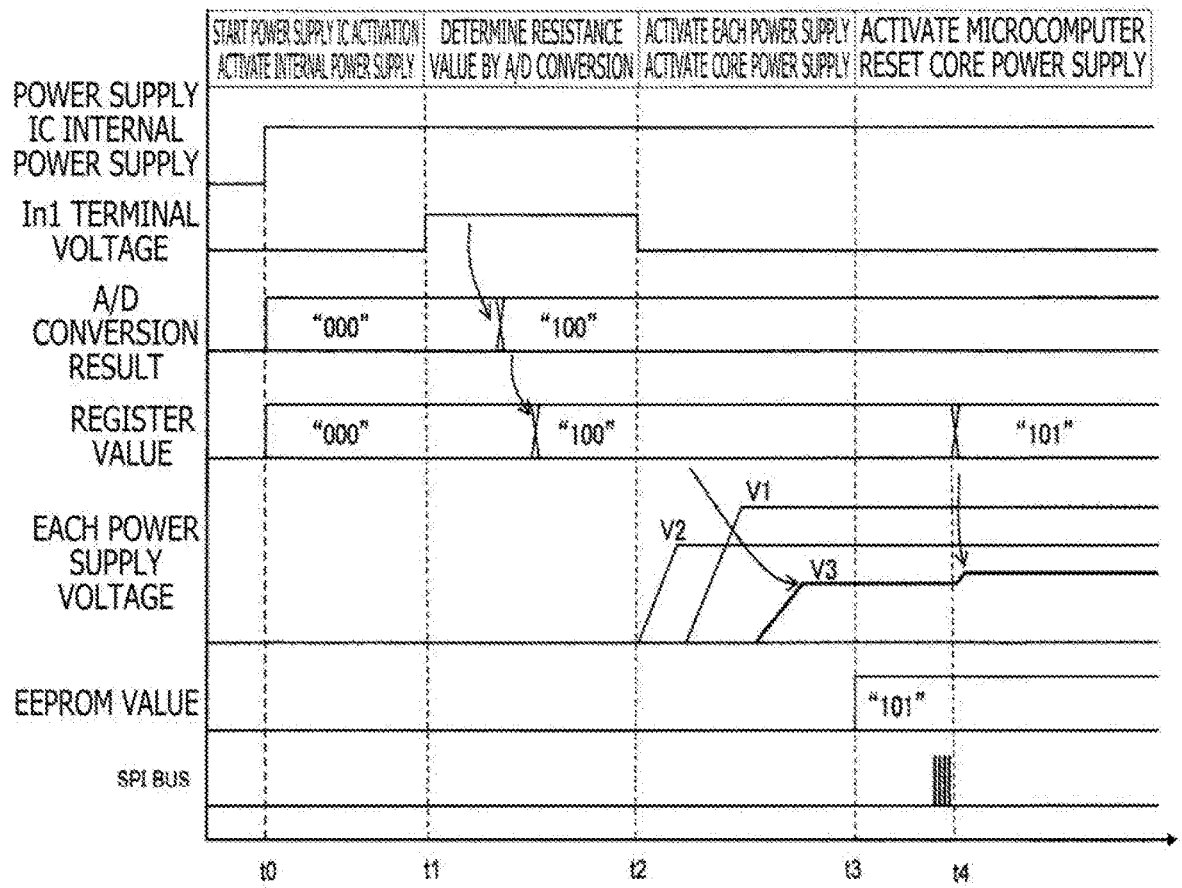
FIG. 4 is a time chart when a register is reset from a microcomputer in the first embodiment of the present invention.

FIG. 4 is a time chart when the register 13 is reset from the microcomputer 19 in the first embodiment of the present invention. The processes until the power supply voltages V1, V2, and V3 activate are the same as those in FIG. 3.

At time t3 in FIG. 4, the digital code stored in the EEPROM 24 of the microcomputer 19 is read via the SPI interface 29, an SPI bus, and the SPI interface 28, and then is set and stored in the register 13.

At time t4, the reference voltage source 14 supplies a voltage according to the digital code after reset in the register 13 to the switch element 27, and the voltage V3 is set.

In this way, a desired digital code or a digital code that has been determined to be used for reset from the test process is recorded in the EEPROM 24 of the microcomputer 19 and then, by writing the digital code recorded in the EEPROM 24 into the register 13 when the recorded value is different from the value in the register 13, the core voltage V3 can be adjusted to a desired voltage or a more accurate voltage, and thus the microcomputer 19 can operate normally.

Further, in the detection operation for the discrete resistor 10 by the A/D converter 12, if a desired digital code is not set in the register 13 due to some trouble, the core voltage V3 can be reset to the normal one according to the code by writing in the register 13 the desired digital code of the EEPROM 24 in the microcomputer 19.

Figure 5:
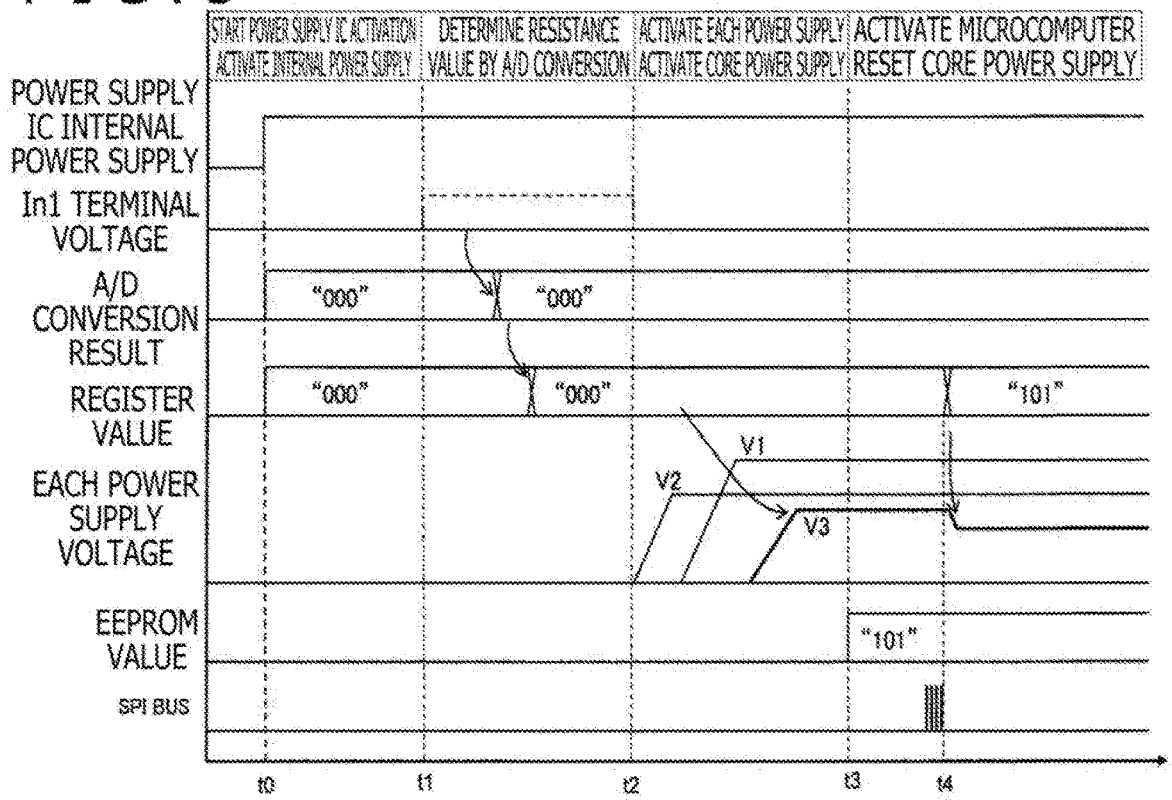
FIG. 5 is an operation time chart when short-circuit occurs between the terminal to which the discrete resistor is connected and the ground in the first embodiment of the present invention.

FIG. 5 is an operation time chart when a short circuit occurs between the In1 terminal to which the discrete resistor 10 is connected and the ground, in the first embodiment of the present invention.

In FIG. 5, the desired digital code is "101," but 0 V is indicated at the In1 terminal because the In1 terminal is short-circuited to ground. Therefore, the A/D converter 12 determines that the digital code is "000" which is not a desired value, and this digital code is held in the register 13 (time t1 to time t2).

Since the core voltage V3 is set according to the digital code "000" held in the register 13, the voltage does not become a desired voltage (time t2 to time t3).

However, even if the core voltage V3 is undesired, once the microcomputer 19 can be activated at time t3, the desired digital code in the EEPROM 24 is read and written in the register 13 (time t3 to time t4), and thus the voltage is reset to the normal core voltage V3, whereby the microcomputer 19 can maintain normal operation.

Considering possible failure modes such as the ground short circuit of the terminal In1, the core voltage V3 for the digital code corresponding to the failure is set not to exceed the maximum rating of the microcomputer 19. Thus, even in the case of a failure such as a ground short circuit, the voltage can be reset to a normal voltage from the microcomputer 19 and the normal operation of the power supply circuit 22 that is an electronic control device can be continued.

Summary of the First Embodiment

As described above, the power supply circuit 22 according to the first embodiment of the present invention can change the core voltage V3 to be supplied to the microcomputer 19 with a simple method of replacing the specific discrete resistor 10 externally attached to the power supply IC 18.

Thus, even when different microcomputers are used, the identical power supply IC 18 can be used, and the manufacturing cost of the power supply IC 18 can be reduced and the development period can be shortened.

In other words, a low-cost electronic control device can be implemented that enables the power supply voltage supplied to the microcomputer to be varied with a simple method and that enables an identical power supply IC to be adapted to various microcomputers.

Second Embodiment

Next, the second embodiment of the present invention will be described.

Figure 2:
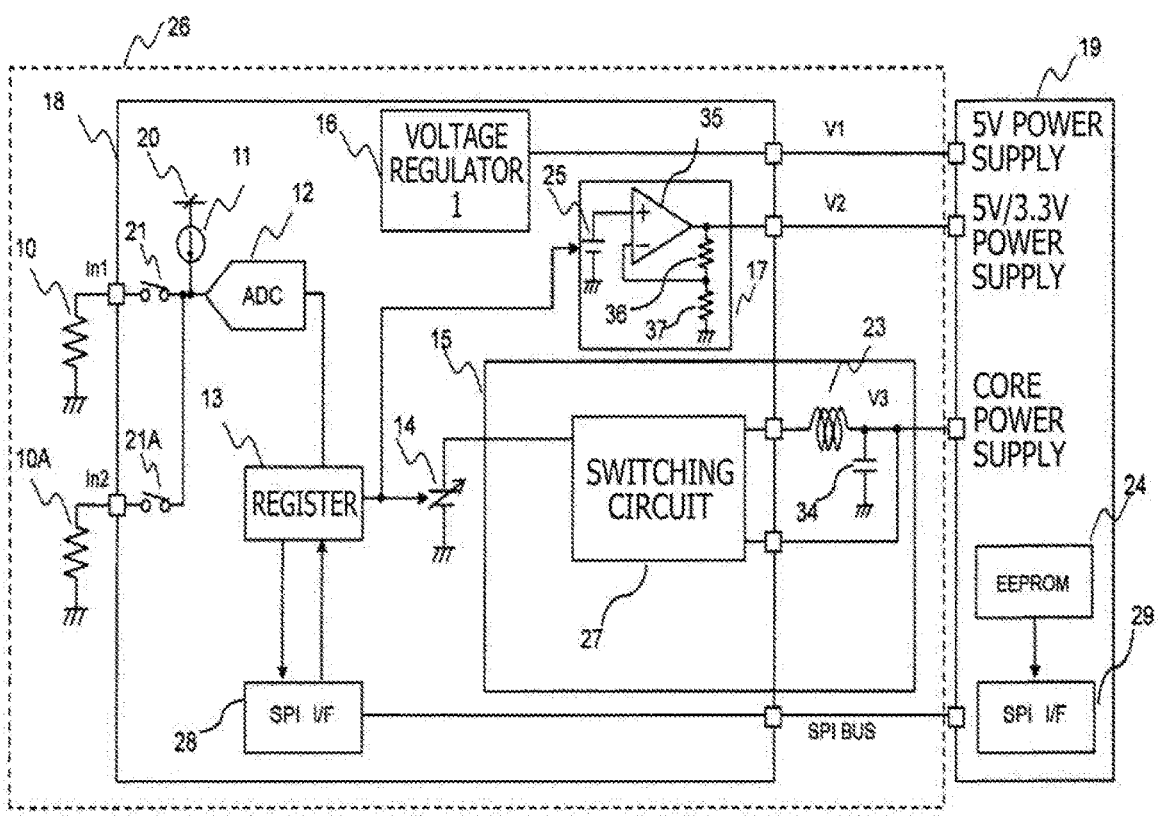
FIG. 2 is a schematic configuration diagram of an electronic control device including a power supply IC, according to a second embodiment of the present invention.

FIG. 2 is a schematic configuration diagram of a power supply circuit 26 that is an electronic control device including the power supply IC 18, according to the second embodiment of the present invention.

The second embodiment depicted in FIG. 2 is different from the first embodiment depicted in FIG. 1 in that the power supply circuit 26 in the second embodiment includes a discrete resistor 10A (second resistor) and a second switch 21A, and has the function of adjusting the reference voltage of the power supply voltage V2 of the voltage regulator 17 by the digital code output of the register 13.

Here, the voltage regulator 17 in the second embodiment includes a reference voltage 25, an operational amplifier 35, and resistors 36 and 36. The reference voltage 25 is connected to the positive input terminal of the operational amplifier 35, and the output terminal of the operational amplifier 35 is grounded via the resistors 36 and 37. The connection point between the resistors 36 and 37 is connected to the negative input terminal of the operational amplifier 35. Then, the output of the operational amplifier 35 becomes the output voltage V2.

The reference voltage 25 is adjusted to a plurality of levels by the digital code output of the register 13.

The discrete resistor generally has a certain variation in its resistance value, and the resistor 10 attached to the power supply IC 18 for determining the resistance value also has a certain variation. For this reason, the power supply voltage options that can be set are limited with one discrete resistor 10.

In the example of the first embodiment, the discrete resistor (first discrete resistor) 10 can bring eight options of the core voltage V3 with a 3-bit digital code. Note that, not only 3-bit design but also design of more bits can be carried out depending on selection of the accuracy of the discrete resistor 10 and design of the power supply IC 18.

Here, by adding the second discrete resistor 10A, when the resistor 10A has the same 3-bit setting as the resistor 10 for example, the resistor 10 and the resistor 10A can have setting of a total of 64 power supply voltages of six bits.

As the power supply voltage setting patterns increase, a more accurate core voltage V3 can be set.

Further, another power supply voltage V2 can be a power supply voltage of 3.3 or 5 V supplied to the microcomputer 19. A generally used microcomputer requires a 3.3 or 5 V power supply. The setting of the reference voltage 25 can be switched by using one bit of the settable digital code increased by the second discrete resistor 10A to thereby switch the power supply voltage V2 between 3.3 and 5 V.

Further, by providing the switch 21A between the current source 11 and the second discrete resistor 10A, the discrete resistor 10 and the discrete resistor 10A can be separately connected to the A/D converter 12, and a plurality of resistors, namely the discrete resistors 10 and 10A can be detected by one A/D converter 12.

By holding six bits of data that includes three bits detected by using the discrete resistor 10 as upper bits and three bits detected by using the discrete resistor 10A as lower bits, in the register 13, and by setting the power supply voltage 14 and the reference voltage 25, desired core voltage V3 and power supply voltage V2 are generated.

In the second embodiment, similarly to the first embodiment, by setting a desired digital code in the EEPROM 24 of the microcomputer 19 or by setting therein a more optimal digital code in the pre-shipment test process, the core voltage V3 and the power supply voltage V2 can be reset by writing a digital code in the register 13 through the SPI communication or the like after activation of the microcomputer 19.

Figure 6:
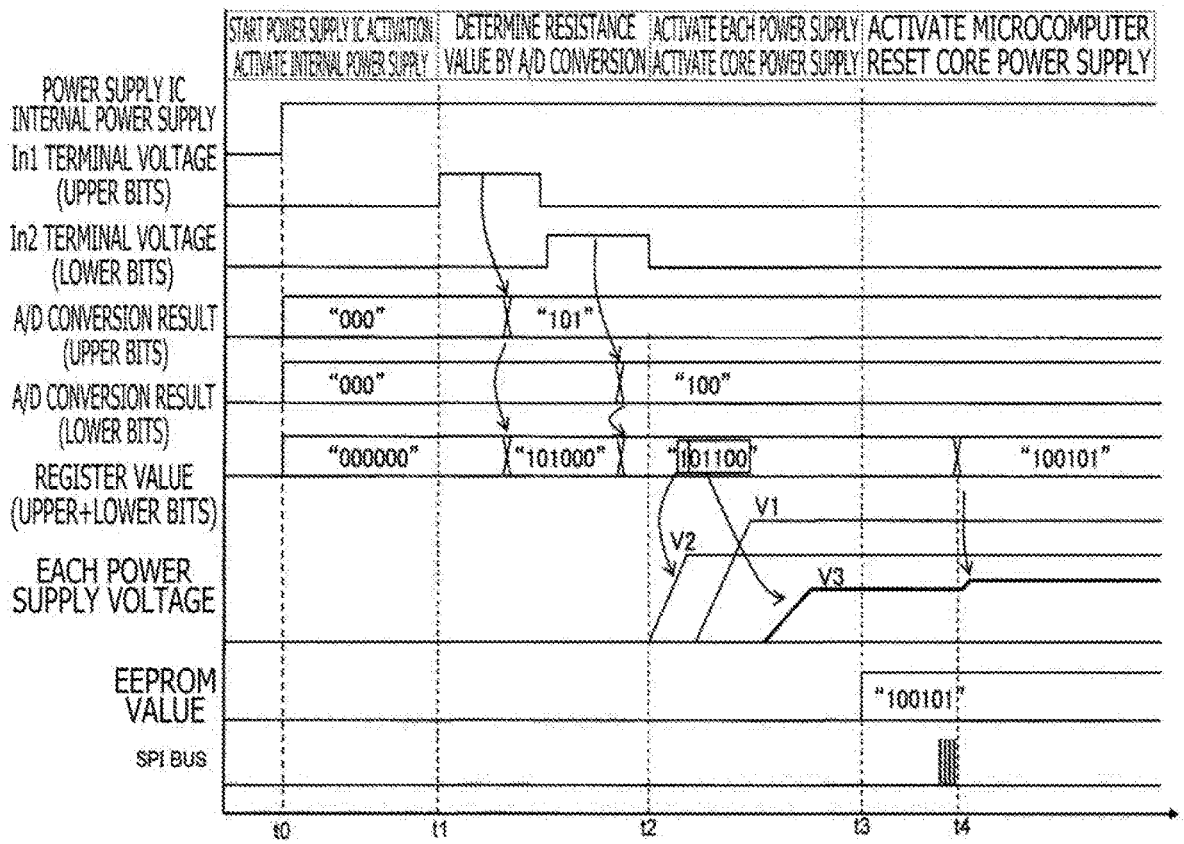
FIG. 6 is a time chart of the operation of the power supply circuit and in the case of resetting the power supply voltage from a microcomputer, in the second embodiment of the present invention.

FIG. 6 is a time chart of the operation of the power supply circuit 26 and in the case of resetting the power supply voltage from the microcomputer 19, in the second embodiment.

In FIG. 6, similarly to the operation depicted in FIG. 4, first, the upper three bits of the discrete resistor 10 are determined by the A/D converter 12. Thereafter, the lower three bits of the discrete resistor 10A is determined by the A/D converter 12 through the switch 21A, thus a total of six bits of the register 13 are determined (time t0 to time t2).

Here, when the most significant bit of the six bits of the register 13 is used for setting the power supply voltage V2 and the remaining five bits are used for setting the core voltage V3, the power supplies are activated to secure the desired power supply voltages V2, V3 and V1 according to each setting and supplied to the microcomputer 19.

When the digital data in the EEPROM 24 of the microcomputer 19 differs from the data in the register 13 after power is supplied to the microcomputer 19, the core voltage V3 can be reset (time t2 to time t4) by writing the digital code of the EEPROM 24 in the register 13 through SPI communication (SPI interface 28 and SPI interface 29).

Summary of the Second Embodiment

As described above, in the power supply circuit 26 according to the second embodiment of the present invention, the core voltage V3 and the power supply voltage V2 to be supplied to the microcomputer 19 can be changed by a simple method of replacing the specific discrete resistor 10 and the discrete resistor 10A externally attached to the power supply IC 18.

Thus, even when different microcomputers are used, the identical power supply IC 18 can be used and the manufacturing cost of the power supply IC 18 can be reduced and the development period can be shortened.

In other words, a low-cost electronic control device can be implemented that enables the power supply voltage supplied to the microcomputer to be varied with a simple method and that enables an identical power supply IC to be adapted to various microcomputers.

Furthermore, according to the second embodiment of the present invention, two resistors 10 and 10A are used to increase the external discrete resistors, and not only the voltage V3 but also the voltage V2 has setting options of a large number of voltage values, thus the set values of the power supply voltage can be increased and a more accurate power supply voltage can be set.

Third Embodiment

Next, the third embodiment of the present invention will be described.

In the first and second embodiments, the core voltage V3 and the power supply voltage V2 are set by switching the discrete resistors 10 and 10A. However, the switching of the core voltage V3 and the power supply voltage V2 can be carried out by other methods without limiting the method to switching the resistors.

FIGS. 7(A) to 7(F) are diagrams each depicting only parts different from the first embodiment or second embodiment in the third embodiment of the present invention, and depicting a configuration example of a discrete component made up of a discrete resistor, a discrete capacitor, and a combination thereof.

Figure 7A:
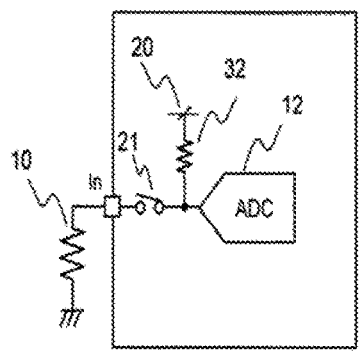
FIGS. 7A to 7F are diagrams each depicting a configuration example of a discrete component and depicting only a part different from the first embodiment or second embodiment in a third embodiment of the present invention.

FIG. 7(A) depicts a configuration in which the current source 11 in the first and second embodiments is replaced with an internal resistor 32 in order to detect the discrete resistor 10.

Also in the configuration depicted in FIG. 7(A), the voltage generated at the In terminal can be converted into a digital code by the A/D converter 12.

Figure 7B:
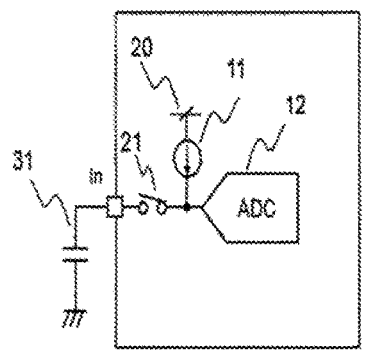

FIG. 7(B) depicts a configuration in which the discrete resistor 10 is replaced with a discrete capacitor 31.

In order to detect the capacitance value of the discrete capacitor 31, the voltage of the In terminal after a certain time can be converted by the A/D converter 12 by charging the discrete capacitor 31 by the current source 11.

Figure 7C:
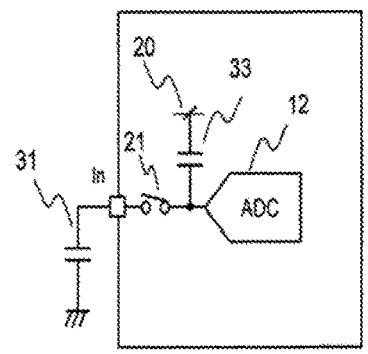

FIG. 7(C) depicts a configuration in which the discrete resistor 10 is replaced with the discrete capacitor 31 and the current source 11 is replaced with an internal capacitor 33. The voltage at the In terminal determined by the capacitance ratio between the discrete capacitor 31 and the internal capacitor 33 can be converted by the A/D converter 12.

Figure 7D:
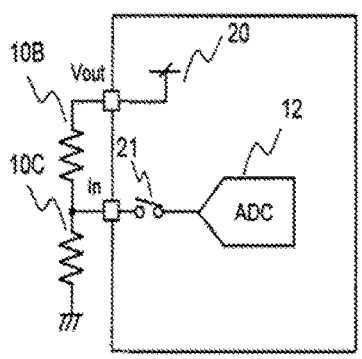
Figure 7E:
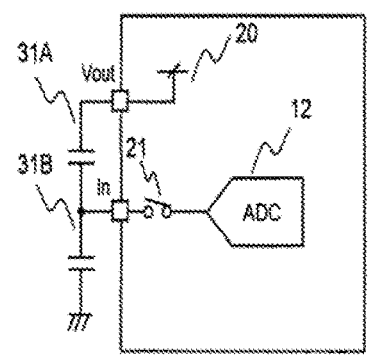
Figure 7F:
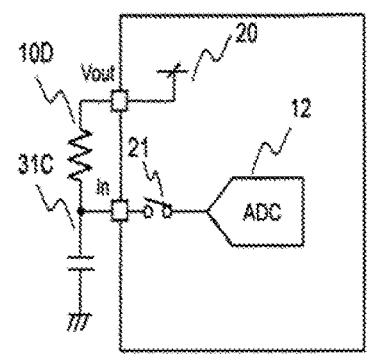

FIGS. 7(D), 7(E), and 7(F) are configuration examples in the case of using two or more discrete components.

In general, since discrete components can be set with high accuracy, the design of In terminal voltage with high accuracy is possible by employing the configuration of FIG. 7(D), and multiplication of bits by A/D conversion with high accuracy is easy, thus multiple setting of the power supply voltage can be performed. First, in FIG. 7(D), the voltage of the internal voltage source 20 is output to the Vout terminal of the power supply IC 18. The Vout terminal is connected to GND via resistors 10B and 10C, and the connection point between the resistors 10B and 10C is connected to the In terminal.

In other words, the discrete components are two discrete resistors 10B and 10C connected in series with each other, and the first switch 21 is connected to a connection midpoint between the two discrete resistors 10B and 10C connected in series, and further two discrete resistors 10B and 10C connected in series are connected to the internal voltage source 20 of the power supply integrated circuit (IC) 18.

With the above configuration, a voltage divided by the discrete resistors 10B and 10C can be input to the In terminal, and the voltage can be converted by the A/D converter 12.

FIG. 7(E) depicts an example in which the resistors 10B and 10C depicted in FIG. 7(D) are replaced with a discrete capacitor 31A and a discrete capacitor 32B and depicts a configuration using a capacitance ratio between the discrete capacitor 31A and the discrete capacitor 32B.

In other words, the first switch 21 is connected to the connection midpoint between two discrete capacitors 31A and 31B connected in series with each other, and the two discrete capacitors 31A and 31B connected in series are connected to the internal voltage source 20 in the power supply integrated circuit (IC) 18.

The voltage of the internal voltage source 20 is output after the capacitors 31A and 31B are once biased to 0 V, and thereby a voltage corresponding to the capacitance ratio of the discrete capacitors 31A and 32B is generated at the In terminal, thus the voltage can be converted by the A/D converter 12.

FIG. 7(F) depicts an example in which the resistors 10B and 10C of FIG. 7(D) are replaced with a discrete resistor 10D and a discrete capacitor 31C, and the voltage charged according to the time constant determined by the resistor 10D and the capacitor 31C is generated in the In terminal.

In other words, the first switch 21 is connected to the connection midpoint between the discrete resistor 10D and the discrete capacitor 31C connected in series with each other, and the discrete resistor 31C and the discrete capacitor 10D connected in series are connected to the internal voltage source 20 of the power supply integrated circuit (IC) 18.

With the above configuration, the voltage after a certain time can be converted by the A/D converter 12.

In each example of the third embodiment, the same effects as those of the first and second embodiments can be obtained.

Regarding Modifications of the Present Invention

The present invention is not limited to the above-described embodiments, and includes various modifications.

For example, the above-described embodiments have been described in detail for easy understanding of the present invention, and are not necessarily limited to those having all the described configurations.

Further, a part of the configuration of one embodiment can be replaced with the configuration of another embodiment, and the configuration of another embodiment can be added to the configuration of one embodiment. Still further, addition of other configurations, deletion, and replacement can be carried out for a part of the configuration of each embodiment.

For example, the power supply configurations of the power supply voltages V1, V2, and V3 are the series power supplies 16 and 17 and the switching power supply 15, respectively, but any power supply does not depend on the power supply form and can be implemented in various power supply forms.

In addition, the number of bits of the A/D converter 12 for the discrete resistors 10 and 10A described in the first and second embodiments is only an example, and increase in the bit number for one discrete resistor or increase in the bit number by using a plurality of discrete resistors is possible.

Further, the switching by the discrete component described in the third embodiment can be combined with the first and second embodiments. Still further, the present invention is not limited to the discrete resistor, the discrete capacitor, and the combination thereof described in the third embodiment, and can be configured by any combination of discrete components.

Furthermore, the electronic control device of the present invention can be applied to other things such as an industrial robot using a microcomputer in addition to be applied to an electronic control device used as a voltage source of a microcomputer for vehicle control.

The switching power supply 15 and the voltage regulators 16 and 17 described above can be defined as voltage adjustment units, and the switching power supply 15 is defined as a first voltage adjustment unit, the voltage regulator 16 is defined as a second voltage adjustment unit, and the voltage regulator 17 is defined as a third voltage adjustment unit.

Further, the discrete resistors 10, 10A, 10B, 10C, and 10D and the discrete capacitors 31, 31A, 31B, and 31C are collectively defined as discrete components.

DESCRIPTION OF REFERENCE CHARACTERS 10, 10A, 10B, 10C, 10D: Discrete resistor
11: Current source
12: A/D converter
13: Register
14: Reference voltage
15: Switching power supply
16, 17: Voltage regulator
18: Power supply IC
19: Microcomputer
20: Internal voltage source
21, 21A: Switch
22, 26: Power supply circuit
23: Inductor
24: EEPROM
25: Reference voltage
27: Switching circuit
28, 29: SPI interface
31, 31A, 31B, 31C: Discrete capacitor
32: Internal resistor
33: Internal capacitor
34: Capacitor
35: Operational amplifier
36, 37: Resistor

The invention claimed is:

1. An electronic control device comprising:
an integrated circuit having a voltage adjustment unit; and
a discrete component connected to the integrated circuit, wherein
voltage output from the voltage adjustment unit is changed by changing the discrete component; and
the integrated circuit includes:
an A/D converter to which the discrete component is connected,
a register for storing a digital code output from the A/D converter, and
a variable voltage source in which a voltage corresponding to the digital code stored in the register is set, and
the voltage adjustment unit adjusts the voltage according to the voltage of the variable voltage source.

2. The electronic control device according to claim 1, wherein
the discrete component includes a discrete resistor.

3. The electronic control device according to claim 2, wherein
the integrated circuit further includes
a first switch connecting the resistor and the A/D converter, and
a current source connected to a point between the first switch and the A/D converter.

4. The electronic control device according to claim 2, wherein
the discrete component includes a first resistor and a second resistor.

5. The electronic control device according to claim 4, wherein
the integrated circuit further includes
a first switch connecting the first resistor and the A/D converter,
a current source connected to a point between the first switch and the A/D converter, and
a second switch connecting the second resistor and the A/D converter.

6. The electronic control device according to claim 2, wherein
the integrated circuit further includes
a first switch connecting the resistor and the A/D converter, and
an internal resistance that is connected to a point between the first switch and the A/D converter and that is connected to an internal voltage source of the integrated circuit.

7. The electronic control device according to claim 2, wherein
the discrete component includes two discrete resistors connected in series with each other,
the integrated circuit further includes a first switch connected to a connection midpoint between the two discrete resistors connected in series with each other, and
the two discrete resistors connected in series with each other are connected to an internal voltage source of the integrated circuit.

8. The electronic control device according to claim 1, wherein
the voltage output from the voltage adjustment unit is a voltage to be supplied to a microcomputer, and the integrated circuit further includes an interface for reading a digital code recorded in a memory of the microcomputer and for storing the digital code in the register.

9. The electronic control device according to claim 1, wherein
the discrete component includes a discrete capacitor, and
the integrated circuit further includes
a first switch connecting the discrete capacitor and the A/D converter, and
a current source connected to a point between the first switch and the A/D converter.

10. The electronic control device according to claim 1, wherein
the discrete component includes a discrete capacitor, and
the integrated circuit further includes
a first switch connecting the discrete capacitor and the A/D converter, and
an internal capacitor connected to a point between the first switch and the A/D converter.

11. The electronic control device according to claim 1, wherein
the electronic control device includes a power supply for a microcomputer for vehicle control.

12. The electronic control device according to claim 1, wherein
the discrete component includes two discrete capacitors connected in series with each other,
the integrated circuit further includes a first switch connected to a connection midpoint between the two discrete capacitors connected in series with each other, and
the two discrete capacitors connected in series with each other are connected to an internal voltage source of the integrated circuit.

13. The electronic control device according to claim 1, wherein
the discrete component includes a discrete resistor and a discrete capacitor connected in series with each other,
the integrated circuit further includes a first switch connected to a connection midpoint between the discrete resistor and the discrete capacitor connected in series with each other, and
the discrete resistor and the discrete capacitor connected in series with each other are connected to an internal voltage source of the integrated circuit.

* * * * *